(12) United States Patent
Tin et al.

(10) Patent No.: US 10,424,441 B2
(45) Date of Patent: Sep. 24, 2019

(54) ULTRA-HIGH CHARGE DENSITY ELECTRETS AND METHOD OF MAKING SAME

(71) Applicant: Honeywell International Inc., Morris Plains, NJ (US)

(72) Inventors: Steven Tin, Plymouth, MN (US); Neil Krueger, St. Paul, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/803,155

(22) Filed: Nov. 3, 2017

(65) Prior Publication Data

US 2019/0013151 A1    Jan. 10, 2019

Related U.S. Application Data (60) Provisional application No. 62/528,863, filed on Jul. 5, 2017.

(51) Int. Cl.
| | | |
|---|---|---|
| *H01G 7/02* | (2006.01) | |
| *H04B 1/04* | (2006.01) | |
| *H02N 1/08* | (2006.01) | |
| *B81C 1/00* | (2006.01) | |

(52) U.S. Cl.
CPC ......... *H01G 7/025* (2013.01); *B81C 1/00515* (2013.01); *H02N 1/08* (2013.01); *H04B 1/04* (2013.01); *B81C 2201/0114* (2013.01); *B81C 2201/0115* (2013.01)

(58) Field of Classification Search
CPC . H01G 7/025; H01G 7/00; H01G 7/02; B81C 1/00515; B81C 2201/0114; B81C 2201/0115; H02N 1/08; H04B 1/04; H04R 19/00; H04R 19/01; H04R 31/00
See application file for complete search history.

(56) References Cited

U.S. PATENT DOCUMENTS

| | | | |
|---|---|---|---|
| 7,568,479 B2 * | 8/2009 | Rabinowitz | G02B 5/08 |
| | | | 126/600 |
| 7,993,959 B2 * | 8/2011 | Katz | H01L 27/283 |
| | | | 257/E21.414 |
| 8,241,940 B2 | 8/2012 | Moslehi et al. | |
| 8,853,521 B2 | 10/2014 | Moslehi et al. | |
| 9,343,299 B2 | 5/2016 | Wang et al. | |
| 9,559,617 B2 * | 1/2017 | Landa | H01J 45/00 |

(Continued)

FOREIGN PATENT DOCUMENTS

WO    2015111689 A1    7/2015

OTHER PUBLICATIONS

European Patent Office, Extended European Search Report from EP Application No. 18180256.2 dated Dec. 17, 2018, "from Foreign Counterpart of U.S. Appl. No. 15/803,155", filed Dec. 17, 2018, pp. 1-7, Published in: EP.

(Continued)

*Primary Examiner* — Pablo N Tran
(74) *Attorney, Agent, or Firm* — Fogg & Powers LLC (57) ABSTRACT

An ultra-high charge density electret is disclosed. The ultra-high charge density electret includes a three-dimensional structure having a plurality of sidewalls. A porous silicon dioxide film is formed on the plurality of sidewalls, and the porous silicon dioxide film is charged with a plurality of positive or negative ions.

12 Claims, 5 Drawing Sheets

(56) References Cited

U.S. PATENT DOCUMENTS

| | | |
|---|---|---|
| 9,590,035 B2 | 3/2017 | Wang et al. |
| 2003/0113546 A1* | 6/2003 | Cho ................. B32B 15/08 |
| | | 428/421 |
| 2011/0031839 A1* | 2/2011 | Fullerton ............... G01D 18/00 |
| | | 310/152 |
| 2012/0050101 A1* | 3/2012 | Whiteman ............ G01S 5/0027 |
| | | 342/357.31 |
| 2014/0145554 A1 | 5/2014 | Takeuchi et al. |
| 2015/0061464 A1* | 3/2015 | Park ..................... H01L 41/113 |
| | | 310/329 |
| 2016/0010761 A1 | 1/2016 | Laser et al. |
| 2016/0118912 A1* | 4/2016 | Hayashi ................ B81C 99/002 |
| | | 310/309 |
| 2016/0250649 A1* | 9/2016 | Koike ....................... B03C 3/41 |
| | | 96/74 |
| 2017/0355591 A1* | 12/2017 | Hedenig ............... B81B 3/0021 |

OTHER PUBLICATIONS

Mescheder et al., "Properties of SiO2 electret films charged by ion implantation for MEMS-based energy harvesting systems", Aug. 26, 2009, p. 1-6, Journal of Micromechanics and Microengineering, pp. 1-6, Hochschule Furtwangen University, Published in: Germany.

\* cited by examiner

ULTRA-HIGH CHARGE DENSITY ELECTRETS AND METHOD OF MAKING SAME

BACKGROUND

Electrets are dielectric materials with quasi-permanently embedded static electric charges and/or quasi-permanently polarized dipoles. Notably, electret materials are utilized in many commercial and technical applications, such as, for example, static electric sensing applications (e.g., electret microphones, copy machines), signal transmission applications (e.g., ULF/VLF transmitters operating at 30 kHz and below), and energy harvesting applications (e.g., deriving energy from external sources such as ambient vibrations, wind, heat or light).

The performance of an electret material is proportional to the material's charge density per unit volume of space, or $C/m^3$. However, since the static electric charges often can only be placed on the surfaces of the electret materials involved, the charge densities of these electret materials are often expressed in terms of unit area of space or $C/m^2$. Notably, existing electret materials having higher charge densities are utilized in certain applications to maximize the performance of the application devices involved. However, the maximum charge densities of the electrets are limited primarily by the electrical breakdown threshold level between the dielectric material of the electrets and the surrounding air.

Conventional electret research and development has been limited primarily to two-dimensional or flat-surfaced materials having maximum charge densities of approximately 30 $mC/m^2$. However, the charge densities of these two-dimensional surfaces are considered relatively low due to the shallow penetration depths of the ionized charges. Notably, in many commercial and defense applications, electronic or electromechanical devices utilizing electret materials having much higher charge densities than 30 $mCm^2$ are required. For example, in VLF signal transmission applications, which are utilized for critical long distance and underwater communications, VLF transmitting devices utilizing electret materials having equivalent charge densities of >1 $C/m^2$ are required. In this regard, ULF/VLF transmissions are particularly useful for applications in which signal penetration through certain conductive media (e.g., water, metal, rock, building materials, and the like) is desired. Also, ULF/VLF transmissions are very useful for long range communications applications, because signals in these frequency ranges can be coupled to the virtual ionosphere-to-ground "waveguide" that surrounds the Earth and propagates such signals around the globe with very little attenuation.

Electret materials are generally separated into two groups: organic electret materials (e.g., polymer); and inorganic electret materials (e.g., silicon dioxide). Polymer electret materials generally have a low charge density (<5 $mC/m^2$). Also, polymer materials are not compatible with conventional microelectromechanical system (MEMS) fabrication processes, and thus can present daunting design challenges, for example, in the scaling of arrays.

A notable advantage of silicon dioxide electret materials is that they are compatible with existing silicon MEMS fabrication processes and typically have a much higher charge density (e.g., 34 $mC/m^2$) than organic electret materials such as polymers. Also, another advantage of silicon dioxide electret materials over polymer electret materials is that silicon dioxide electret materials can be embedded with either unipolar or dipolar charges.

For the reasons stated above and for other reasons stated below which will become apparent to those skilled in the art upon reading and understanding the specification, there is a need in the art for very high (e.g., ultra-high) charge density electrets.

SUMMARY

Embodiments disclosed herein present techniques for fabricating ultra-high charge density electrets. In one example embodiment of the disclosure, a plurality of ultra-high charge density electrets are formed by combining a high surface-to-volume ratio, three-dimensional silicon structure with a high surface-area, porous silicon dioxide film to substantially increase the charge densities of the electrets thus formed (e.g., over those of conventional electrets). Specifically, for one example embodiment, a silicon structure (e.g., silicon wafer, die and the like) is etched to form a plurality of positively-tapered sidewalls (e.g., pyramid-shaped), which produces a three-dimensional, textured surface that substantially increases the surface-to-volume ratio of the silicon structure involved. A porous silicon dioxide film is formed on the multiple surfaces of the tapered sidewalls, and a positive (or negative) charge is generated in the porous silicon dioxide film on the multiple surfaces of the tapered sidewalls, which produces a plurality of ultra-high charge density electrets on the surface of the silicon structure involved.

DRAWINGS

Embodiments of the present disclosure can be more easily understood and further advantages and uses thereof more readily apparent, when considered in view of the description of the preferred embodiments and the following figures in which.

In accordance with common practice, the various described features are not drawn to scale but are drawn to emphasize features relevant to the present disclosure. Reference characters denote like elements throughout the figures and text.

DETAILED DESCRIPTION

In the following detailed description, reference is made to the accompanying drawings that form a part hereof, and in which is shown by way of specific illustrative embodiments in which the embodiments may be practiced. These embodiments are described in sufficient detail to enable those skilled in the art to practice the embodiments, and it is to be understood that other embodiments may be utilized and that logical, mechanical and electrical changes may be made without departing from the scope of the present disclosure. The following detailed description is, therefore, not to be taken in a limiting sense.

Figure 1:
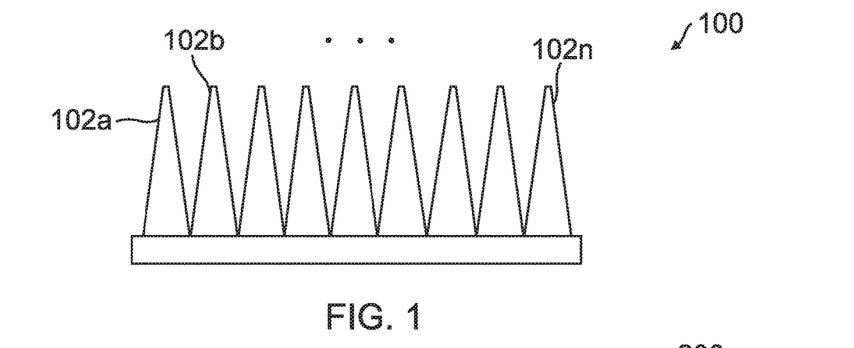
FIG. 1 is a structural diagram illustrating a cross-sectional, side-view of a silicon structure that can be utilized to implement one example embodiment of the present invention.

FIG. 1 is a structural diagram illustrating a cross-sectional, side-view of a silicon structure 100, which can be utilized to implement one example embodiment of the present invention. As illustrated in FIG. 1, the surface of the silicon structure 100 is, for example, textured to include a plurality of three-dimensional structures (e.g., 102a, 102b . . . 102n) having positively-tapered sidewalls. In the example embodiment shown, each one of the three-dimensional structures 102a-102n is pyramid-shaped. However, in a second embodiment, the three-dimensional structures 102a-102n can be shaped differently from that of a pyramid. For example, each one of the three-dimensional structures 102a-102n can be formed in the shape of a pillar (e.g., having vertical sidewalls), a trench (e.g., having vertical or tapered sidewalls), or a spike. Notably, a technical advantage of the three-dimensional structures 102a-102n is that they substantially increase the surface-to-volume ratio of the silicon structure 100 over that of a conventional, two-dimensional (e.g., flat-surfaced) silicon structure. Also, the increased surface-to-volume ratio of the silicon structure 100 over that of conventional, two-dimensional surfaces produces a significant enhancement in the electric charge density gain (e.g., approximately 50 times higher) over that produced by the conventional, two-dimensional surfaces.

Figure 2:
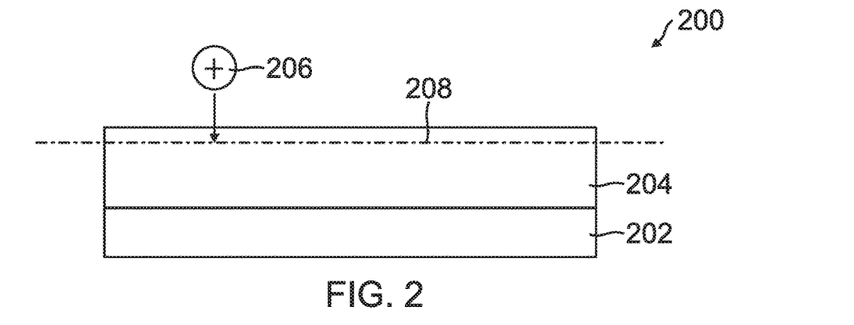
FIG. 2 is a structural diagram illustrating a cross-sectional, side-view of a second silicon structure that can be utilized to implement one example embodiment of the present invention.

FIG. 2 is a structural diagram illustrating a cross-sectional, side-view of a silicon structure 200, which can be utilized to implement one example embodiment of the present invention. As illustrated in FIG. 2, the silicon structure 200 includes a silicon layer 202 (e.g., silicon wafer, die and the like) and a layer (e.g., film) of porous silicon 204 formed (e.g., etched) onto the surface of the silicon layer 202. Notably, a property of porous silicon is its large surface-to-volume ratio compared to that of non-porous silicon, which substantially increases the effective electric charge density of the porous silicon over that of an equivalent structure of non-porous silicon.

Porous silicon structures (e.g., layer 204) can be fabricated utilizing a suitable electrochemical etching process, with the etching parameters governing the size and alignment of the pores and the percentage of the voided space due to the pores. As such, for the example embodiment illustrated in FIG. 2, the porous silicon structure 204 is oxidized utilizing a suitable silicon oxidation process to generate a porous silicon dioxide film 204. Reportedly, porous silicon dioxide structures have been produced with specific surface areas of approximately 300 m$^2$/cm$^3$. Thus, for example, utilizing a 100 μm porous silicon dioxide film, a surface-to-volume enhancement of 30,000 times (theoretically) over non-porous silicon films could be achieved. However, as indicated by the limited depth of the positively-ionized charge 206 shown in FIG. 2, it is a difficult process to implant charges into the porous silicon film 204 by more than 2 μm (e.g., the ion penetration depth indicated by the dotted line 208) without damaging the film. Thus, as a practical matter, only a surface-to-volume enhancement of approximately 600 times can actually be achieved in a two-dimensional, porous silicon structure, such as the exemplary silicon structure 204 depicted in FIG. 2.

Figure 3:
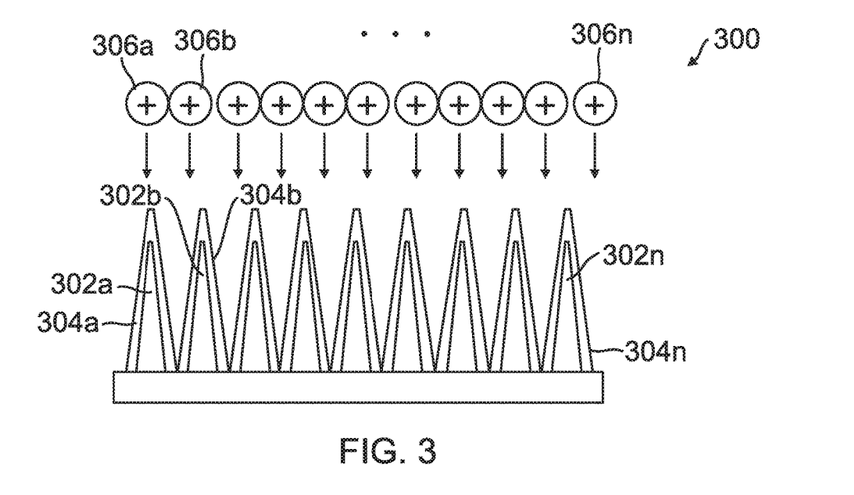
FIG. 3 is a structural diagram illustrating a cross-sectional, side-view of a third silicon structure, which can be utilized to implement one example embodiment of the present invention.

FIG. 3 is a structural diagram illustrating a cross-sectional, side-view of an enhanced three-dimensional silicon structure 300, which can be utilized to implement one example embodiment of the present invention. As illustrated in FIG. 3, a surface of the silicon structure 300 is textured to include a plurality of three-dimensional silicon structures 302a-302n having positively-tapered sidewalls (e.g., pyramid-shaped sidewalls). A layer (e.g., film) of porous silicon dioxide (e.g., 304a-304n) is formed on the surfaces of the multiple sidewalls of the silicon structures 302a-302n. Notably, in the example embodiment depicted in FIG. 3, the enhanced three-dimensional silicon structure 300 advantageously combines the technical features of the three-dimensional silicon structure 100 depicted in FIG. 1 with the technical features of the porous silicon dioxide film 204 depicted in FIG. 2. As such, assuming (e.g., conservatively) that the three-dimensional silicon structure 302 can provide an enhancement in surface-to-volume gain of 30 times, and the porous silicon dioxide film 304 can provide an enhancement in surface-to-volume gain of 600 times, then an overall improvement in surface-to-volume gain of 18,000 times can be achieved (e.g., combining the technical features disclosed in FIGS. 1 and 2) in forming the enhanced silicon structure 300 disclosed in FIG. 3. This substantial increase in electret charge density over that of existing electret materials enables the advanced development of such critical technologies as, for example, low size, weight and power (SWaP) ULF/VLF transmitters that are capable of transmitting signals at 30 kHz and below.

Figure 4:
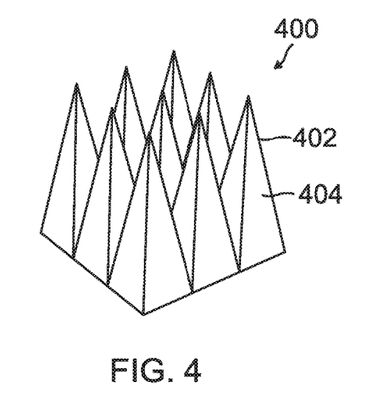
FIG. 4 is a structural diagram illustrating a three-dimensional, perspective view of the example embodiment depicted in FIG. 3.

FIG. 4 is a structural diagram illustrating a three-dimensional, perspective view 400 of a portion of the enhanced, three-dimensional silicon structure 300 shown in the exemplary embodiment depicted in FIG. 3. As described above with respect to FIG. 3, each three-dimensional silicon structure such as, for example, the pyramid-shaped, three-dimensional structure 402 has a layer or film of porous silicon dioxide 404 on each one of the (e.g., four) surfaces of the exemplary three-dimensional structure 402. Notably, the perspective view 400 is provided here primarily to facilitate one's understanding of the example embodiment depicted in FIG. 3.

Figure 5:
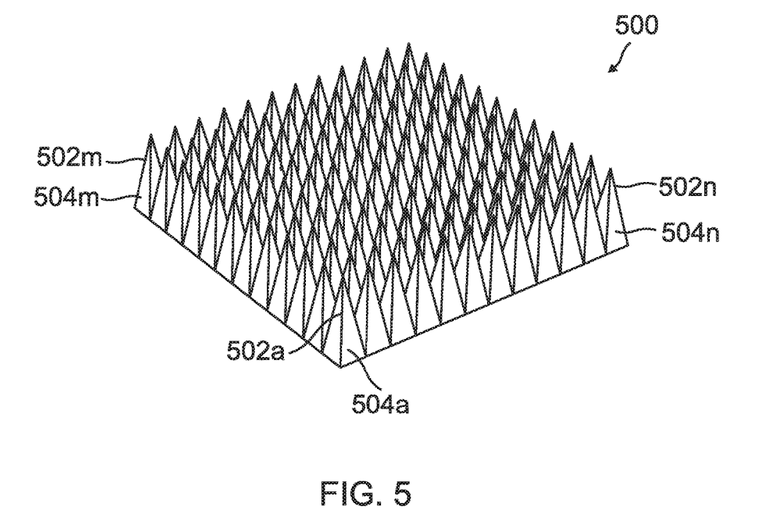
FIG. 5 is a structural diagram illustrating a second three-dimensional, perspective view of the example embodiment depicted in FIG. 3.

FIG. 5 is a structural diagram illustrating a three-dimensional, perspective view 500 of a large portion of the enhanced, three-dimensional silicon structure 300 shown in the exemplary embodiment depicted in FIG. 3. Notably, in the exemplary view illustrated in FIG. 5, a plurality of three-dimensional silicon structures are shown (e.g., in the form of an array with "n" rows and "m" columns in which "n" and "m" may or may not represent equal numbers). In any event, each three-dimensional silicon structure 502a-502n,m in the array has a layer or film of porous silicon dioxide 504a-504n,m on each one of the (e.g., four) surfaces of the exemplary three-dimensional structures shown. Notably, the expanded view 500 is provided here primarily to illustrate the "textured" surface of the enhanced, three-dimensional silicon structure depicted in FIG. 3. As such, the electret material formed by the array of (e.g., pyramid-shaped) three-dimensional structures 502a-502n,m having surface films of porous silicon dioxide 504a-504n,m can likely achieve an overall improvement in surface-to-volume gain of approximately 18,000 times over that of conventional electret materials.

Figure 6:
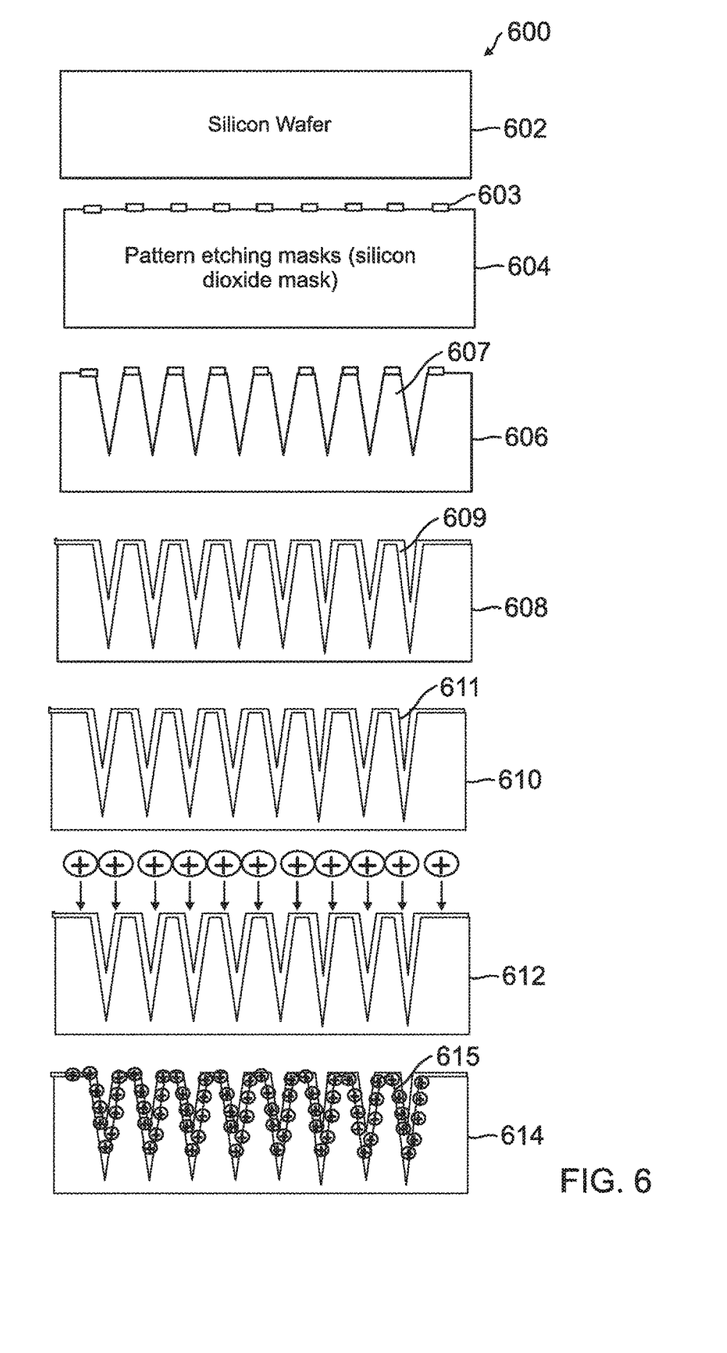
FIG. 6 is a structural diagram illustrating a plurality of two-dimensional, side views of structures that result from an exemplary process that can be utilized to fabricate the three-dimensional silicon structures illustrated in FIGS. 3-5.

FIG. 6 is a structural diagram illustrating a plurality of two-dimensional, side views of structures that result from an exemplary process 600, which can be utilized to fabricate the enhanced, three-dimensional silicon structures illustrated in FIGS. 3-5. Referring to FIG. 6, a suitable silicon wafer 602 is provided (e.g., formed or grown). A suitable (e.g., photolithographic) patterning process 604 is then utilized to form a plurality of etching masks (e.g., silicon dioxide etching masks 603) on the silicon wafer. A suitable etching process (e.g., Deep Reactive Ion Etching or DRIE process) 606 is utilized to form a plurality of three-dimensional silicon structures (e.g., 102a-102n in FIG. 1). In one example embodiment, the depth/thickness of each three-dimensional structure (e.g., 607) thus formed is approximately 200 μm. However, in another embodiment, the depth/thickness of each three-dimensional structure thus formed can range from <1 μm up to the thickness of the wafer being used. A suitable etching process (e.g., electrochemical etching) 608 is then utilized to remove the masks and form a porous silicon layer 609 on the multiple surfaces of each one of the three-dimensional silicon structures. A suitable oxidation process (e.g., thermal, etc.) 610 is then utilized to form a porous silicon dioxide layer 611 on the multiple surfaces of each one of the three-dimensional silicon structures. Next, a suitable ionization process (e.g., ion implantation) 612 is utilized to generate a charge (positive or negative ions) in the three-dimensional structures. A suitable annealing process 614 can then be utilized, if deemed necessary, to anneal the ionized surfaces and thereby enhance the charge retention time for the electret materials thus formed.

Figure 7:
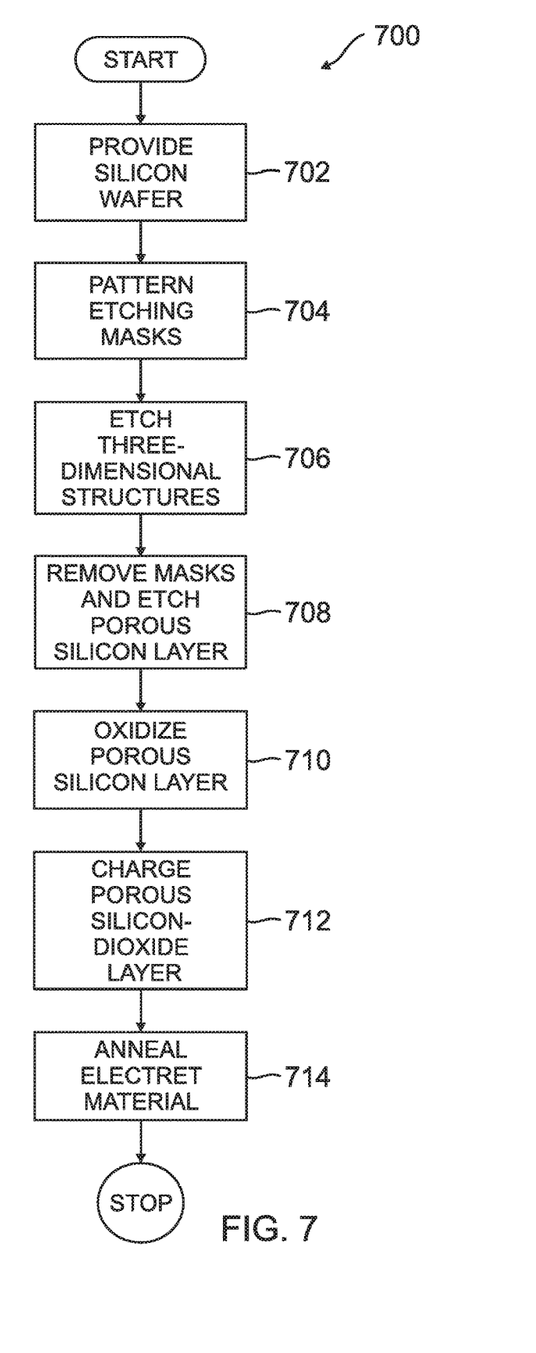
FIG. 7 is a flow diagram illustrating an exemplary method that can be utilized to perform the exemplary fabrication process depicted in FIG. 6.

FIG. 7 is a flow diagram illustrating an exemplary method 700 that can be utilized to perform the exemplary fabrication process 600 depicted in FIG. 6. Referring to FIGS. 6 and 7, the method begins by forming or otherwise providing a silicon wafer (or silicon disk, die and the like) (702). Next, a pattern of (e.g., silicon dioxide) etching masks are formed (704). An etching process is then utilized to form a plurality of three-dimensional structures (706). The masks are then removed and a porous silicon layer is formed (etched) on the multiple surfaces of the three-dimensional structures (708). The porous silicon layer is then oxidized to form a porous silicon dioxide layer (710). Next, the porous silicon dioxide layer is charged (e.g., implanting positive or negative ions) to produce an enhanced electret material (712). The enhanced electret material can then be annealed, for example, if a higher charge retention time is desired (714).

Figure 8:
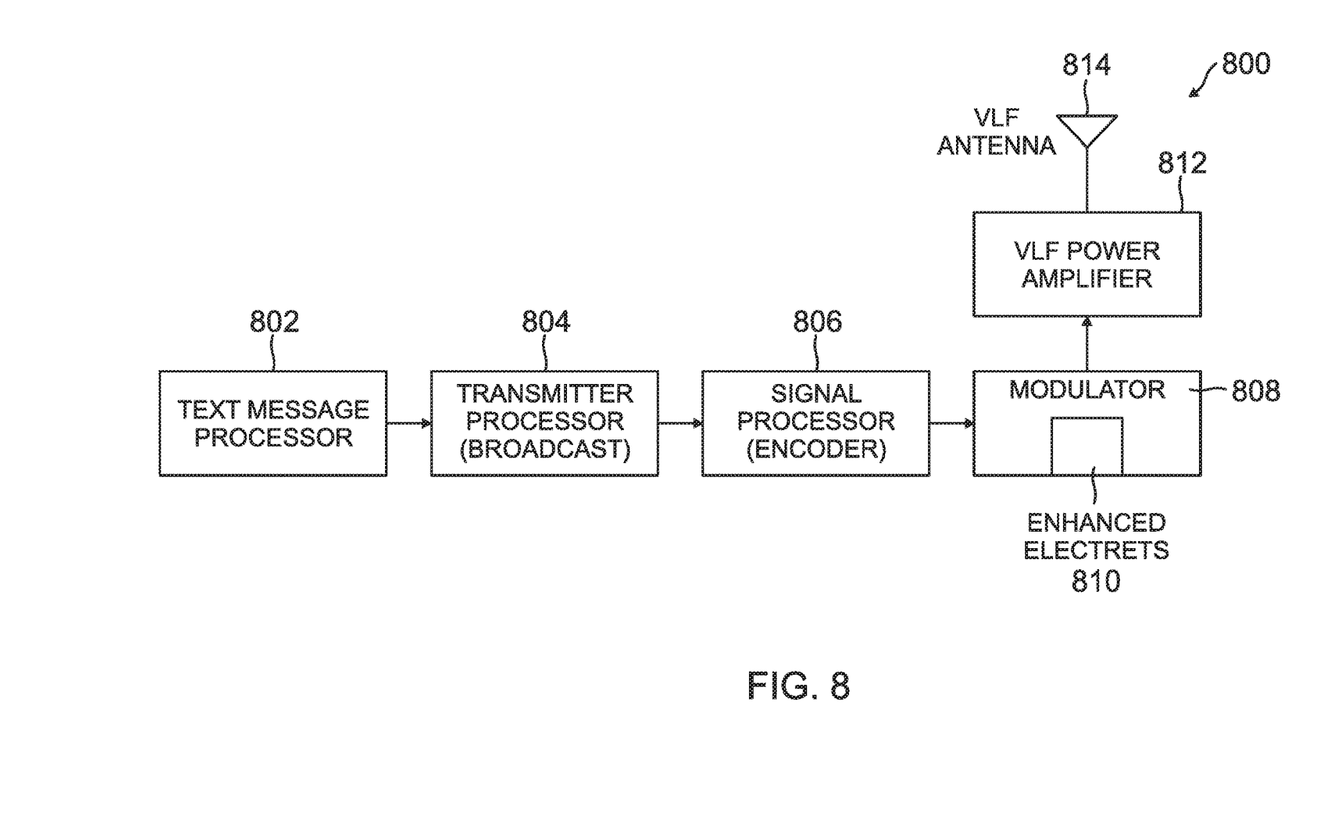
FIG. 8 is a simplified, schematic block diagram of a system that can be utilized to implement one example embodiment of the present invention.

FIG. 8 is a simplified, schematic block diagram of a system 800, which can be utilized to implement one example embodiment of the present invention. For this exemplary embodiment, the system 800 is a VLF transmitter system. Referring to FIG. 8, the example system 800 includes a text message processor 802 (e.g., voice messaging is not practical at VLF) configured to input and process text messages from users, and a transmitter (e.g., broadcast) processor 804 coupled to the text message processor 802 and configured to process numerous text messages from users into a suitable broadcast format for VLF. A signal processor/encoder 806 is coupled to the transmitter processor 804 and configured to encode the text messages received from the transmitter processor 804 into a suitable encoded format for VLF transmissions. A modulator 808 is coupled to the signal processor 806 and configured to convert the encoded text messages into suitable VLF signals. The VLF signals generated in the modulator 808 are coupled to the VLF power amplifier 812 and then transmitted via the antenna 814. Notably, in one example embodiment, the modulator 808 includes suitable electronic and/or electromechanical circuitry that is configured to physically move the ultra-high charge density (enhanced) electrets 810 in the modulator 808 and thereby generate the VLF signals to be broadcast or transmitted via the VLF antenna 814. As such, the enhanced electret materials 810 (e.g., as described above with respect to FIGS. 3-6) are capable of producing an overall improvement in surface-to-volume gain of approximately 18,000 times over that of the conventional electret materials being utilized to transmit VLF signals. Consequently, the SWaP and transmission performances of the VLF transmitter system 800 are substantially increased over those of the existing VLF transmitters utilizing conventional electret materials.

It should be understood that elements of the above described embodiments and illustrative figures may be used in various combinations with each other to produce still further embodiments which are explicitly intended as within the scope of the present disclosure.

EXAMPLE EMBODIMENTS

Example 1 includes an ultra-high charge density electret, comprising: a three-dimensional structure; a plurality of sidewalls on the three-dimensional structure; and a porous silicon dioxide film formed on the plurality of sidewalls, wherein the porous silicon dioxide film is charged with a plurality of positive or negative ions.

Example 2 includes the ultra-high charge density electret of Example 1, wherein the three-dimensional structure is a pyramid-shaped silicon structure.

Example 3 includes the ultra-high charge density electret of any of Examples 1-2, wherein the three-dimensional structure is formed on a surface of a silicon wafer.

Example 4 includes the ultra-high charge density electret of any of Examples 1-3, wherein the three-dimensional structure is at least one of a trench-shaped, pillar-shaped, or spike-shaped silicon structure.

Example 5 includes the ultra-high charge density electret of any of Examples 1-4, further comprising a plurality of three-dimensional structures.

Example 6 includes the ultra-high charge density electret of Example 5, wherein the plurality of three-dimensional structures comprises an array of three-dimensional structures.

Example 7 includes a method for forming an ultra-high charge density electret material, comprising: providing a silicon wafer; forming a patterned etching mask on a surface of the silicon wafer; forming a plurality of three-dimensional structures on the surface of the silicon wafer; forming a porous silicon layer on at least one surface of each one of the plurality of three-dimensional structures; forming an oxidized porous silicon layer on the at least one surface of the each one of the plurality of three-dimensional structures; and forming a charge on the oxidized porous silicon layer on the at least one surface of the each one of the plurality of three-dimensional structures.

Example 8 includes the method of Example 7, wherein the forming the porous silicon layer further comprises forming the porous silicon layer on a plurality of the surfaces of said each one of the plurality of three-dimensional structures.

Example 9 includes the method of any of Examples 7-8, wherein the forming the plurality of three-dimensional structures on the surface of the silicon wafer comprises etching the plurality of three-dimensional structures onto the surface of the silicon wafer.

Example 10 includes the method of any of Examples 7-9, wherein the forming the oxidized porous silicon layer further comprises forming a layer of silicon dioxide, etching the layer of silicon dioxide, and thereby forming a plurality of pores in the layer of silicon dioxide.

Example 11 includes the method of any of Examples 7-10, wherein the forming the plurality of three-dimensional structures on the surface of the silicon wafer comprises forming a plurality of pyramid-shaped structures on the silicon wafer.

Example 12 includes the method of any of Examples 7-11, wherein the forming the plurality of three-dimensional structures on the surface of the silicon wafer comprises forming a plurality of trench-shaped, pillar-shaped, or spike-shaped structures on the silicon wafer.

Example 13 includes the method of any of Examples 7-12, wherein the forming the charge on the oxidized porous silicon layer comprises implanting a plurality of positive or negative ions into the at least one surface of the each one of the plurality of three-dimensional structures.

Example 14 includes the method of any of Examples 7-13, further comprising annealing the oxidized porous silicon layer on the at least one surface of the each one of the plurality of three-dimensional structures.

Example 15 includes a system, comprising: a text message processor; a broadcast processor coupled to an output of the text message processor; a signal processor coupled to an output of the broadcast processor; a modulator coupled to an output of the signal processor; a power amplifier coupled to an output of the modulator; and an antenna coupled to an output of the power amplifier, wherein the modulator includes a plurality of ultra-high charge density electrets, comprising: a plurality of three-dimensional structures; a plurality of sidewalls on each one of the plurality of three-dimensional structures; and a porous silicon dioxide film formed on the plurality of sidewalls, wherein the porous silicon dioxide film is charged with a plurality of positive or negative ions.

Example 16 includes the system of Example 15, wherein each one of the plurality of three-dimensional structures is a pyramid-shaped silicon structure.

Example 17 includes the system of any of Examples 15-16, wherein the plurality of three-dimensional structures are formed on a surface of a silicon wafer or die.

Example 18 includes the system of any of Examples 15-17, wherein each one of the plurality of three-dimensional structures is at least one of a trench-shaped, pillar-shaped, or spike-shaped silicon structure.

Example 19 includes the system of any of Examples 15-18, wherein the plurality of three-dimensional structures comprises an array of three-dimensional structures.

Example 20 includes the system of any of Examples 15-19, wherein the plurality of ultra-high charge density electrets are components of an electromechanical circuit configured to generate a Very Low Frequency (VLF) signal.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the presented embodiments. Therefore, it is manifestly intended that embodiments be limited only by the claims and the equivalents thereof.

What is claimed is:

1. A transmitter system, comprising:
an ultra-high charge density electret comprising:
a three-dimensional structure;
a plurality of sidewalls on the three-dimensional structure; and a porous silicon dioxide film formed on the plurality of sidewalls, wherein the porous silicon dioxide film is charged with a plurality of positive or negative ions
a modulator comprising the ultra-high charge density electret: and
a signal processor coupled to the modulator, wherein circuitry within the modulator physically moves the ultra-high charge density electret to generate a signal in response to receiving a signal from the signal processor.

2. The transmitter system of claim 1, wherein the three-dimensional structure is a pyramid-shaped silicon structure.

3. The transmitter system of claim 1, wherein the three-dimensional structure is formed on a surface of a silicon wafer.

4. The transmitter system of claim 1, wherein the three-dimensional structure is at least one of a trench-shaped, pillar-shaped, or spike-shaped silicon structure.

5. The transmitter system of claim 1, further comprising a plurality of three-dimensional structures.

6. The transmitter system of claim 5, wherein the plurality of three-dimensional structures comprises an array of three-dimensional structures.

7. A system, comprising:
a text message processor;
a broadcast processor coupled to an output of the text message processor;
a signal processor coupled to an output of the broadcast processor;
a modulator coupled to an output of the signal processor;
a power amplifier coupled to an output of the modulator;
an antenna coupled to an output of the power amplifier,
wherein the modulator includes a plurality of ultra-high charge density electrets, comprising:
a plurality of three-dimensional structures;
a plurality of sidewalls on each one of the plurality of three-dimensional structures; and
a porous silicon dioxide film formed on the plurality of sidewalls, wherein the porous silicon dioxide film is charged with a plurality of positive or negative ions; and
wherein circuitry within the modulator physically moves the ultra-high charge density electrets to generate a signal in response to the output of the signal processor.

8. The system of claim 7, wherein each one of the plurality of three-dimensional structures is a pyramid-shaped silicon structure.

9. The system of claim 7, wherein the plurality of three-dimensional structures are formed on a surface of a silicon wafer or die.

10. The system of claim 7, wherein each one of the plurality of three-dimensional structures is at least one of a trench-shaped, pillar-shaped, or spike-shaped silicon structure.

11. The system of claim 7, wherein the plurality of three-dimensional structures comprises an array of three-dimensional structures.

12. The system of claim 7, wherein the plurality of ultra-high charge density electrets are components of an electromechanical circuit configured to generate a Very Low Frequency (VLF) signal.

* * * * *